United States Patent
Agarwala et al.

(10) Patent No.: US 10,019,459 B1
(45) Date of Patent: Jul. 10, 2018

(54) DISTRIBUTED DEDUPLICATION IN A DISTRIBUTED SYSTEM OF HYBRID STORAGE AND COMPUTE NODES

(71) Applicant: Springpath, LLC, Wilmington, DE (US)

(72) Inventors: Sandip Agarwala, Cupertino, CA (US); Shravan Gaonkar, Gainsville, FL (US); Mallikarjunan Mahalingam, Cupertino, CA (US); Smit Shah, Sunnyvale, CA (US); Faraz Shaikh, Sunnyvale, CA (US); Praveen Vegulla, Cupertino, CA (US); Krishna Yadappanavar, Sunnyvale, CA (US)

( * ) Notice: Subject to any disclaimer, the term of this patent is extended or adjusted under 35 U.S.C. 154(b) by 229 days.

(21) Appl. No.: 14/135,495

(22) Filed: Dec. 19, 2013

Related U.S. Application Data (60) Provisional application No. 61/739,685, filed on Dec. 19, 2012.

(51) Int. Cl.
*G06F 17/30* (2006.01)
*G06F 3/06* (2006.01)

(52) U.S. Cl.
CPC ...... *G06F 17/30156* (2013.01); *G06F 3/0641* (2013.01); *G06F 3/0608* (2013.01); *G06F 17/30159* (2013.01); *G06F 17/30371* (2013.01)

(58) Field of Classification Search
CPC .......... G06F 12/0253; G06F 17/30156; G06F 3/0608; G06F 3/0641; G06F 3/067; G06F 17/30159; G06F 17/30371; G06F 17/30952

See application file for complete search history.

(56) References Cited

U.S. PATENT DOCUMENTS

| | | |
|---|---|---|
| 5,692,185 A | 11/1997 | Nilsen |
| 6,247,139 B1 | 6/2001 | Walker et al. |
| 6,338,117 B1 | 1/2002 | Challenger |
| 6,928,526 B1 | 8/2005 | Zhu et al. |
| 7,032,216 B1 | 4/2006 | Nizhegorodov |
| 7,065,619 B1 | 6/2006 | Zhu et al. |
| 7,194,492 B2 | 3/2007 | Seidenberg |
| 7,246,211 B1 | 7/2007 | Beloussov |
| 7,395,378 B1 | 7/2008 | Pendharkar |

(Continued)

OTHER PUBLICATIONS

"The Case for Persistent Full Clones," Deepstorage.net, http://getgreenbytes.com/wp-content/uploads/2013/05/FULL_CLONE_PERSISTENT_VDI-FINAL.pdf, 18 pages.

(Continued)

*Primary Examiner* — Kris Mackes
*Assistant Examiner* — Merilyn Nguyen (57) ABSTRACT

A distributed storage system called StorFS that performs distributed data deduplication is described. In an exemplary embodiment, a storage controller server determines if there is duplicative data in a distributed storage system. In this embodiment, the storage controller server determines if an entity is duplicated in the distributed storage system in line with an incoming input/output operation. The storage controller server determines if the entity is duplicated in the distributed storage system by receiving the entity and looking up the entity in a data deduplication table. If the entity exists in the data deduplication table, the storage controller server updates the metadata for the entity to point to the duplicate entity.

20 Claims, 10 Drawing Sheets

(56) References Cited

U.S. PATENT DOCUMENTS

| | | | |
|---|---|---|---|
| 7,467,265 B1 | 12/2008 | Tawri | |
| 7,584,338 B1 | 9/2009 | Bicker et al. | |
| 7,757,202 B2 | 7/2010 | Dahlstedt | |
| 7,953,774 B2 | 5/2011 | Cong | |
| 8,190,823 B2 | 5/2012 | Waltermann | |
| 8,204,862 B1* | 6/2012 | Paulzagade | G06F 17/30156 707/679 |
| 8,286,030 B1 | 10/2012 | Chatterjee et al. | |
| 8,429,162 B1 | 4/2013 | Wang et al. | |
| 8,527,544 B1* | 9/2013 | Colgrove | G06F 3/0608 707/791 |
| 8,768,977 B2 | 7/2014 | Golab | |
| 8,832,039 B1 | 9/2014 | Sorenson | |
| 8,930,648 B1* | 1/2015 | Storer | G06F 12/0292 711/154 |
| 8,935,302 B2 | 1/2015 | Flynn | |
| 9,098,201 B2 | 8/2015 | Benjamin | |
| 9,110,792 B1 | 8/2015 | Douglis | |
| 9,201,794 B2 | 12/2015 | Gill | |
| 9,251,021 B2 | 2/2016 | Calder | |
| 9,251,160 B1* | 2/2016 | Wartnick | G06F 17/30159 |
| 9,448,927 B1* | 9/2016 | Agarwala | G06F 12/0253 |
| 9,483,484 B1* | 11/2016 | Sridharan | G06F 17/30153 |
| 9,792,306 B1* | 10/2017 | Wartnick | G06F 17/303 |
| 9,811,551 B1* | 11/2017 | Colgrove | G06F 17/30371 |
| 2001/0052073 A1 | 12/2001 | Kern et al. | |
| 2003/0014599 A1 | 1/2003 | McBreatry et al. | |
| 2003/0189930 A1 | 10/2003 | Terrell et al. | |
| 2004/0098424 A1 | 5/2004 | Seidenberg | |
| 2004/0243650 A1 | 12/2004 | McCrory | |
| 2005/0071550 A1 | 3/2005 | Lowe | |
| 2005/0114402 A1 | 5/2005 | Guthrie | |
| 2005/0193272 A1* | 9/2005 | Stager | G06F 11/2074 714/42 |
| 2005/0268054 A1 | 12/2005 | Werner et al. | |
| 2006/0101189 A1 | 5/2006 | Chandrasekaran et al. | |
| 2008/0109624 A1 | 5/2008 | Gilbert | |
| 2009/0089537 A1 | 4/2009 | Vick | |
| 2009/0292746 A1 | 11/2009 | Bricker et al. | |
| 2010/0064110 A1 | 3/2010 | Boeltcher | |
| 2010/0070715 A1 | 3/2010 | Waltermann | |
| 2010/0082550 A1 | 4/2010 | Cong | |
| 2010/0191783 A1 | 7/2010 | Mason | |
| 2010/0198795 A1 | 8/2010 | Chen | |
| 2010/0235335 A1 | 9/2010 | Heman | |
| 2011/0196900 A1 | 8/2011 | Drobychev | |
| 2011/0225214 A1 | 9/2011 | Guo | |
| 2011/0258480 A1 | 10/2011 | Young et al. | |
| 2011/0265085 A1 | 10/2011 | Kedem | |
| 2011/0282842 A1 | 11/2011 | Popovski | |
| 2011/0289345 A1 | 11/2011 | Agesen et al. | |
| 2012/0047111 A1 | 2/2012 | Hayden | |
| 2012/0137054 A1 | 5/2012 | Sadri | |
| 2012/0210095 A1 | 8/2012 | Nellans | |
| 2012/0278512 A1 | 11/2012 | Alatorre et al. | |
| 2012/0297142 A1 | 11/2012 | Gill | |
| 2012/0303577 A1 | 11/2012 | Calder | |
| 2012/0331249 A1 | 12/2012 | Benjamin | |
| 2013/0055252 A1 | 2/2013 | Lagar-Cavilla et al. | |
| 2013/0086007 A1* | 4/2013 | Bandopadhyay | G06F 17/30156 707/692 |
| 2013/0097380 A1* | 4/2013 | Colgrove | G06F 17/30159 711/118 |
| 2013/0212234 A1 | 8/2013 | Bartlett et al. | |
| 2013/0290274 A1* | 10/2013 | Patil | G06F 17/30156 707/690 |
| 2013/0297569 A1 | 11/2013 | Hyde, II | |
| 2014/0040199 A1 | 2/2014 | Golab | |
| 2014/0122795 A1 | 5/2014 | Chambliss | |
| 2014/0143213 A1* | 5/2014 | Tal | G06F 17/30156 707/692 |
| 2014/0188819 A1* | 7/2014 | Bagal | G06F 17/30144 707/692 |
| 2015/0039717 A1 | 2/2015 | Chiu et al. | |

OTHER PUBLICATIONS

Rodeh, Ohad, "B-trees, Shadowing, and Clones," *ACM Transactions on Storage (TOS)* 3, No. 4, https://www.usenix.org/legacy/events/lsf07/tech/rodeh.pdf, (2008), 51 pages.

Rodeh, Ohad, "B-trees, Shadowing, and Clones," *ACM Transactions on Computational Logic*, vol. V, No. N, (Aug. 2007), 26 pages.

VMWare Virtual SAN Hardware Guidance—VMWare, Jun. 2009 https://www.vmware.com/files/pdf/products/vsan/VMware-TMD-Virtual-SAN-Hardware-Guidance.pdf.

Shaoshan Liu et al., "Parker: Parallel Gargage Collerctor Based on Virtual Spaces", Computers, IEEE Transactions on Year: 2012, vol. 6, Issue: 11, pp. 1611-1623, DOI: 10.1109/TC.2011.193.

Benjamin Zhu, Kai Lai, Hugo Patterson, "Avoiding the Disk Bottleneck in the Data Domain Deduplication File System", http://usenix.org/legacy/events/fast08/tech/full_papers/zhu/zhu_html/index . . . USENIX Fast 2008, Feb. 2008, 16 pages.

Giuseppe DeCandia et al., Dynamo: Amazon's Highly Available Key-value Store, http://www.allthingsdistributed.com/files/amazon-dynamo-sosp2007.pdf, SOSP'07, Oct. 14-17, 2007, pp. 205-220, Stevenson, Washington, USA, Amazon.com.

Avinash Lakshman et al.,Cassandra—A Decentralized Structured Storage System, http://www.cs.cornell.edu/projects/ladis2009/, Oct. 10, 2009, 6 pages.

John S. Heidemann et al., File-System Development With Stackable Layers, https://www.ece.cmu.edu/~ganger/712.fall02/papers/stackableFS-Heidemann94.pdf, ACM Transactions on Computer Systems, vol. 12, No. 1 Feb. 1994 pp. 58-89.

\* cited by examiner

DISTRIBUTED DEDUPLICATION IN A DISTRIBUTED SYSTEM OF HYBRID STORAGE AND COMPUTE NODES

RELATED APPLICATIONS

Applicant claims the benefit of priority of prior, provisional application Ser. No. 61/739,685, filed Dec. 19, 2012, the entirety of which is incorporated by reference.

FIELD OF INVENTION

This invention relates generally to a storage system and more particularly to distributed data deduplication in a distributed storage system.

BACKGROUND OF THE INVENTION

Enterprise storage systems currently available are proprietary storage appliances that integrate the storage controller functions and the storage media into the same physical unit. This centralized model makes it harder to independently scale the storage systems' capacity, performance and cost. Users can get tied to one expensive appliance without the flexibility of adapting it to different application requirements that may change over time. For small and medium scale enterprise, this may require huge upfront capital cost. For larger enterprise datacenters, new storage appliances are added as the storage capacity and performance requirements increase. These operate in silos and impose significant management overheads.

These enterprise storage systems may support data deduplication, or just deduplication, which refers to removing duplicate data blocks from the storage system, which reduces the space usage and hence, the cost of the system. There are many approaches to achieve deduplication: at the file-level or at the block-level, inline versus offline, etc. Single node deduplication systems are relatively easier to build because the metadata associated with deduplication is located in one place. Distributed deduplication across multiple storage system nodes is harder because the metadata may not be local. Data block deletion requires coordination with multiple nodes to make sure that there are no local and remote references to the data block that is being deleted. Current deduplication implementations build a complete deduplication index. That means, the fingerprint (FP) of the blocks are generated and indexed. Theses indexes are often very large. That would either require input/output (I/O) penalty for reading and verifying dupes or lots of memory to verify a key of a block exists in the storage system.

SUMMARY OF THE DESCRIPTION

A distributed storage system called StorFS that performs distributed data deduplication is described. In an exemplary embodiment, a storage controller server determines if there is duplicative data in a distributed storage system. In this embodiment, the storage controller server determines if an entity is duplicated in the distributed storage system. The storage controller server determines if the entity is duplicated in the distributed storage system by receiving the entity and looking up the entity in a data deduplication table. If the entity exists in the data deduplication table, the storage controller server updates the metadata for the entity to point to the duplicate entity. In one embodiment, the data deduplication table includes hints about which entities are stored in the distributed storage system. In this embodiment, each of the hints is a fingerprint of an entity that is stored in the distributed storage system. In addition, the data deduplication table includes hints about which of a top-K entities are stored in the distributed storage system, where the number of top-K entities is less than a total number of entities stored in the distributed storage system.

Other methods and apparatuses are also described.

BRIEF DESCRIPTION OF THE DRAWINGS

The present invention is illustrated by way of example and not limitation in the figures of the accompanying drawings in which like references indicate similar elements.

DETAILED DESCRIPTION

A distributed storage system called StorFS that performs distributed data deduplication is described. In the following description, numerous specific details are set forth to provide thorough explanation of embodiments of the present invention. It will be apparent, however, to one skilled in the art, that embodiments of the present invention may be practiced without these specific details. In other instances, well-known components, structures, and techniques have not been shown in detail in order not to obscure the understanding of this description.

Reference in the specification to "one embodiment" or "an embodiment" means that a particular feature, structure, or characteristic described in connection with the embodiment can be included in at least one embodiment of the invention. The appearances of the phrase "in one embodiment" in various places in the specification do not necessarily all refer to the same embodiment.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

The processes depicted in the figures that follow, are performed by processing logic that comprises hardware (e.g., circuitry, dedicated logic, etc.), software (such as is run on a general-purpose computer system or a dedicated machine), or a combination of both. Although the processes are described below in terms of some sequential operations, it should be appreciated that some of the operations described may be performed in different order. Moreover, some operations may be performed in parallel rather than sequentially.

The terms "server," "client," and "device" are intended to refer generally to data processing systems rather than specifically to a particular form factor for the server, client, and/or device.

A distributed storage system called StorFS that performs distributed data deduplication is described. For a distributed storage system, data deduplication, or just deduplication, refers to removing duplicate data blocks from the distributed storage system, which reduces the space usage and hence, the cost of the system. In one embodiment, the data may be duplicated across different physical storage controller servers.

In one embodiment, the StorFS system checks to determine if the data being stored is duplicated elsewhere in the StorFS system. In this embodiment, instead of storing full deduplication metadata, the StorFS system uses a hints table to determine whether data is duplicated. This hints table can be stored in fast solid-state devices (SSD) storage or in memory for performance or can be stored in a slower storage device. In this embodiment, a matching 'hint' indicates a potential duplicate. In one embodiment, the hints table stores statistics about a partial set of data in the StorFS system. By using a partial set of data statistics, the StorFS can perform the data deduplication check more efficiently than using a full data deduplication index by using less storage for the hints table and reducing lookup time. The StorFS system creates the hints table by creating a live object map of the data stored in the StorFS system. Using this map, the StorFS system determines a top-K statistics on the data stored in the StorFS system and uses these statistics in the hints table. In one embodiment, there is a global hints table that is used by each of the SC servers to determine if data is being duplicated in the StorFS system. In one embodiment, the hints table map stores a fingerprint for a VBA of content stored in the StorFS system. In another embodiment, the StorFS uses a probabilistic data structure to detect the references to the data blocks. In this embodiment, if a data block is not referenced by any node, the data block becomes a candidate for removal.

Figure 1:
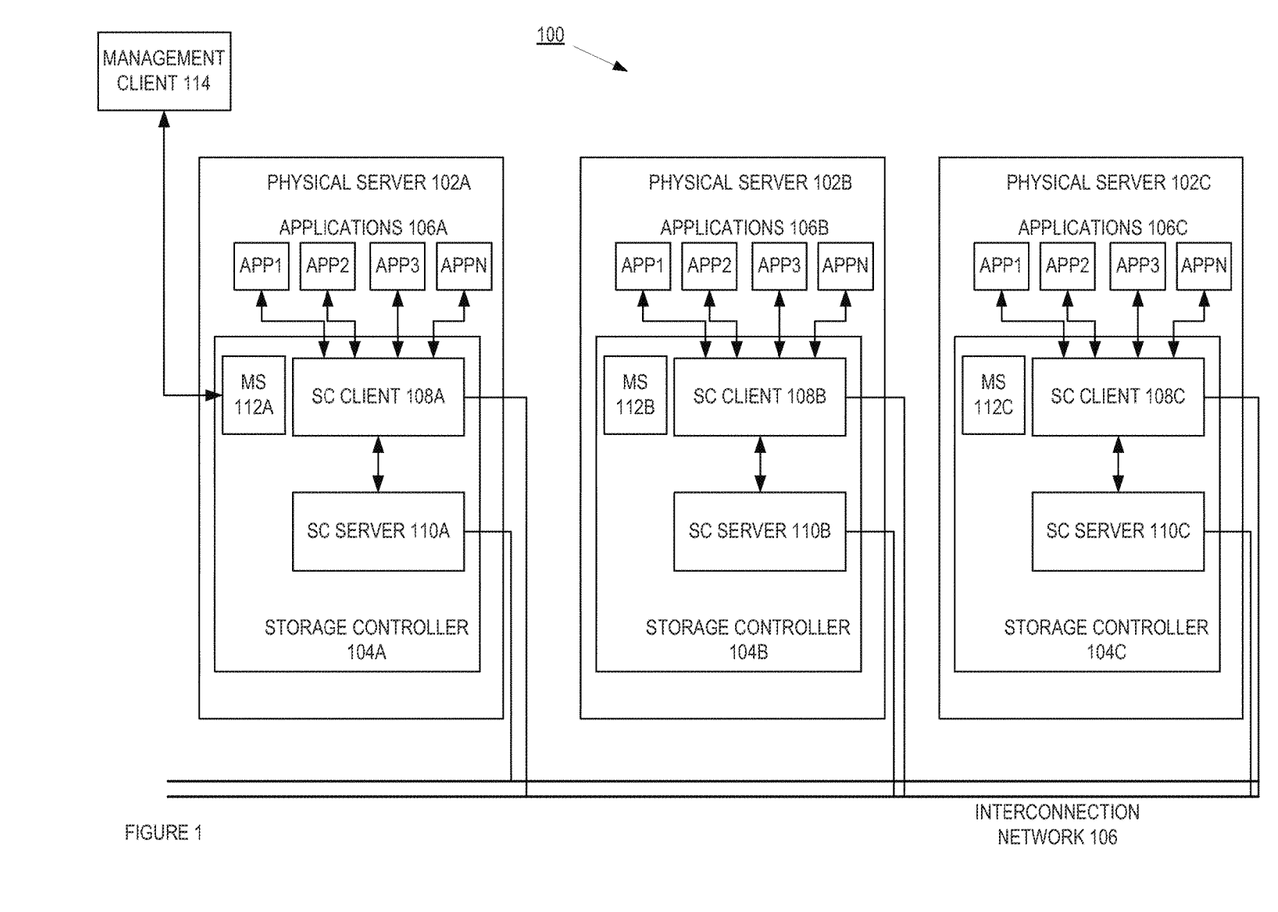
FIG. 1 is an illustration of one embodiment of a high-level view of StorFS system.

FIG. 1 is an illustration of one embodiment of a high-level view of StorFS system 100. In FIG. 1, the StorFS system 100 includes storage nodes 102A-C coupled by an interconnection network 116. While in one embodiment, three storage nodes 102A-C are illustrated as part of the StorFS system 100, in alternate embodiments, there can be more or less storage nodes. For example and in one embodiment, the StorFS system 100 can include up to several hundred storage nodes. In one embodiment, each storage node 102A-C includes a storage controller (SC) client (also called dispatcher) 108A-C, a storage controller (SC) server 110A-C, or both. The SC servers 110A-C manage their underlying storage (e.g., Hard disk drive (HDD), Solid state drives (SSD), PCIe flash, etc.) and collectively provide reliable and unified storage functionality to the SC clients. The SC client 108A-C processes input/output (I/O) requests from the applications that are local to its physical storage node and routes them to the appropriate SC servers for processing. For example and in one embodiment, SC client 108A can send an I/O request locally to SC Server 110A and/or remotely to SC Servers 110B or 110C. The system is capable of exposing many different interfaces to the application like file (e.g. NFS, CIFS), object, key-value, or another type of interface. In one embodiment, the storage node 102A-C can be server, blade server, personal computer, or any other type of device capable of storing data. In one embodiment, the management server 112A-C is an agent that is used to communicate system management data and commands regarding the corresponding storage node 102A-C with the management client 114.

In one embodiment, the design of the StorFS system 100 distributes both the data and the metadata, and this system 100 does not require storing a complete global map for locating individual data blocks in our system. The responsibility of managing metadata is offloaded to each individual storage nodes 102A-C. In one embodiment, a cluster manager (CRM) resides on each SC Server 110 maintains some global metadata, which is small compared to the local metadata. In one embodiment, each logical file (or entity) is partitioned into equal sized "stripe units". The location of a stripe unit is determined based on a mathematical placement function Equation (1):

$$\text{Virtual\_Node\#} = \text{Hash}(\text{Entity}_{Id}, \text{Stripe\_Unit\#})\%\text{Total\_Virtual\_Nodes} \quad (1)$$

$$\text{Stripe\_Unit\#} = \frac{\text{offset}}{\text{Stripe\_Unit\_Size}}\%\text{Stripe\_Unit\_Per\_Stripe}$$

The $\text{Entity}_{Id}$ is an identification of a storage entity that is to be operated upon, the Total_Virtual_Nodes is the total number of virtual nodes in the StorFS system 100, the offset is an offset into the storage entity, and the Stripe_Unit_Size is the size of each stripe unit in the StorFS system 100. The value Stripe_Unit_Per_Stripe is described further below. In one embodiment, the storage entity is data that is stored in the StorFS system 100. For example and in one embodiment, the storage entity could be a file, an object, key-value pair, etc. In this example, the $\text{Entity}_{Id}$ can be an iNode value, a file descriptor, an object identifier, key/value identifier, etc. In one embodiment, an input to a storage operation is the $\text{Entity}_{Id}$ and the offset (e.g., a write, read, query, create, delete, etc. operations). In this embodiment, the $\text{Entity}_{Id}$ is a globally unique identification.

In one embodiment, the StorFS 100 system receives the $\text{Entity}_{Id}$ and offset as input for each requested storage operation from an application 106A-C. In this embodiment, the StorFS system 100 uses the offset to compute a stripe unit number, Stripe_Unit#, based on the stripe unit size, Stripe_Unit_Size, and the number of virtual nodes that the entity can be spread across, Stripe_Unit_Per_Stripe. Using the stripe unit number and the entity identifier ($\text{Entity}_{Id}$), the StorFS system 100 computes the virtual node identifier. As described below, the StorFS system 100 uses a hash function to compute the virtual node identifier. With the virtual node identifier, the StorFS 100 can identify which physical node the storage entity is associated with and can route the request to the corresponding SC server 110A-C.

In one embodiment, each vNode is a collection of either one or more data or metadata objects. In one embodiment, the StorFS system 100 does not store data and metadata in the same virtual node. This is because data and metadata may have different access patterns and quality of service (QoS) requirements. In one embodiment, a vNode does not span across two devices (e.g. a HDD). A single storage disk of a storage node 102A-C may contain multiple vNodes. In one embodiment, the placement function uses that a deterministic hashing function and that has good uniformity over the total number of virtual nodes. A hashing function as known in the art can be used (e.g., Jenkins hash, murmur hash, etc.). In one embodiment, the "Stripe_Unit_Per_Stripe" attribute determines the number of total virtual nodes that an entity can be spread across. This enables distributing and parallelizing the workload across multiple storage nodes (e.g., multiple SC servers 110A-C). In one embodiment, the StorFS system 100 uses a two-level indexing scheme that maps the logical address (e.g. offset within a file or an object) to a virtual block address (VBA) and from the VBAs to physical block address (PBA). In one embodiment, the VBAs are prefixed by the ID of the vNode in which they are stored. This vNode identifier (ID) is used by the SC client and other StorFS system 100 components to route the I/O to the correct cluster node. The physical location on the disk is determined based on the second index, which is local to a physical node. In one embodiment, a VBA is unique across the StorFS cluster, where no two objects in the cluster will have the same VBA.

In one embodiment, the cluster manager (CRM) maintains a database of virtual node (vNode) to physical node (pNode) mapping. In this embodiment, each SC client and server caches the above mapping and computes the location of a particular data block using the above function in Equation (1). In this embodiment, the cluster manager need not be consulted for every I/O. Instead, the cluster manager is notified if there is any change in 'vNode' to 'pNode' mapping, which may happen due to node/disk failure, load balancing, etc. This allows the StorFS system to scale up and parallelize/distribute the workload to many different storage nodes. In addition, this provides a more deterministic routing behavior and quality of service. By distributing I/Os across different storage nodes, the workloads can take advantage of the caches in each of those nodes, thereby providing higher combined performance. Even if the application migrates (e.g. a virtual machine migrates in a virtualized environment), the routing logic can fetch the data from the appropriate storage nodes. Since the placement is done at the stripe unit granularity, access to data within a particular stripe unit goes to the same physical node. Access to two different stripe units may land in different physical nodes. The striping can be configured at different level (e.g. file, volume, etc.) Depending on the application settings, the size of a stripe unit can range from a few megabytes to a few hundred megabytes. In one embodiment, this can provide a good balance between fragmentation (for sequential file access) and load distribution.

Figure 2:
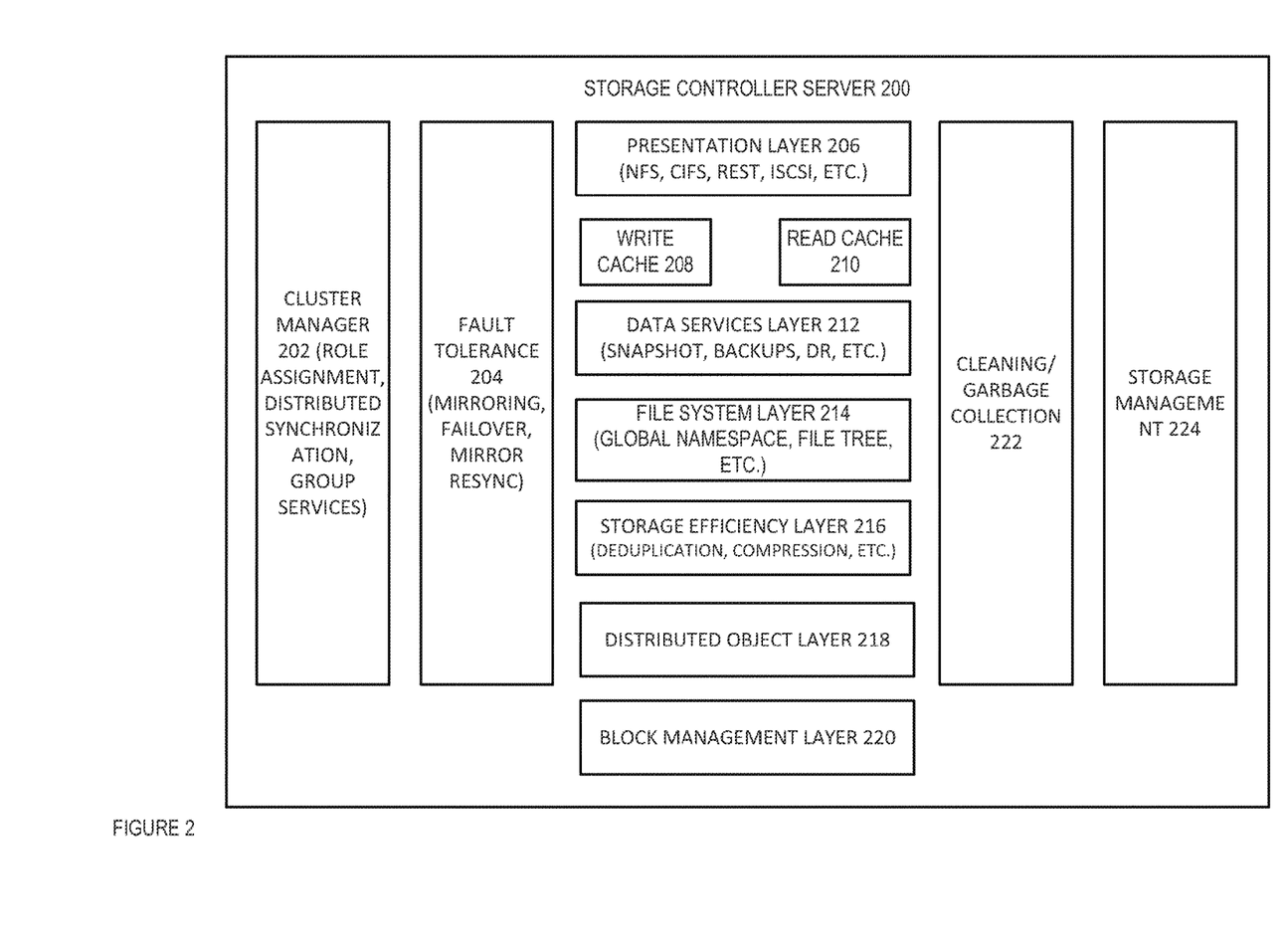
FIG. 2 is an illustration of one embodiment of a system including some of the components that comprises the storage controller server.

FIG. 2 is a block diagram of one embodiment of a storage control server 200. In one embodiment, the Block Management Layer 220 of the storage control server is responsible for formatting, allocating, and freeing storage in fixed block sizes. This layer provides access to different kinds of storage (e.g. SSD, HDD, etc.) in the system. In one embodiment, the Distributed Object Layer 218 of the storage control server uses an API of the Block Management Layer 220 to provide a global distributed object namespace that is accessible over the network. In one embodiment, the Storage Efficiency Layer 216 reduces the size of data footprint on the physical medium using techniques like compression, deduplication, etc. The reduction is achieved without deteriorating the performance or the reliability of the data storage. In one embodiment, the File System Layer 214 provides a logical global namespace abstraction to organize and locate data in the cluster. In one embodiment, the Data Service Layer 212 provides enterprise data services like disaster recovery, fine grained policy management, snapshots/clones, etc. In one embodiment, the Write Cache 208 and the Read Cache 210 Layers provide acceleration for write and read I/O respectively using fast storage devices. In one embodiment, the Write Cache Layer 208 includes the write log as described below. In one embodiment, the Presentation Layer 206 provides an interface to access the StorFS storage using well-known standard protocols like NFS, CIFS, REST, iSCSI, etc. In one embodiment, the Cluster Manager (CRM) Layer 202 is responsible for the coordination across distributed StorFS components, delegating responsibilities and maintaining a consistent global state of the system. In one embodiment, the Fault Tolerance Layer 204 is responsible for resiliency and making sure that the data is available and consistent even after the failure of a software or hardware component (disk, server, network, etc.). In one embodiment, the Garbage Collection Layer 222 is responsible for reclaiming dead space that result due to entities getting deleted or updated. This layer efficiently determines the storage blocks that are not used (or referenced) and makes them available for new data to be written. In one embodiment, the Storage Management Layer 224 provides a framework to configure, monitor, analyze and report on the operation of the overall StorFS cluster storage system as well as individual logical and physical entities in the cluster. In one embodiment, each of the layers mentioned above are fully distributed and each layer does not rely on any centralized components for their operations.

Figure 3:
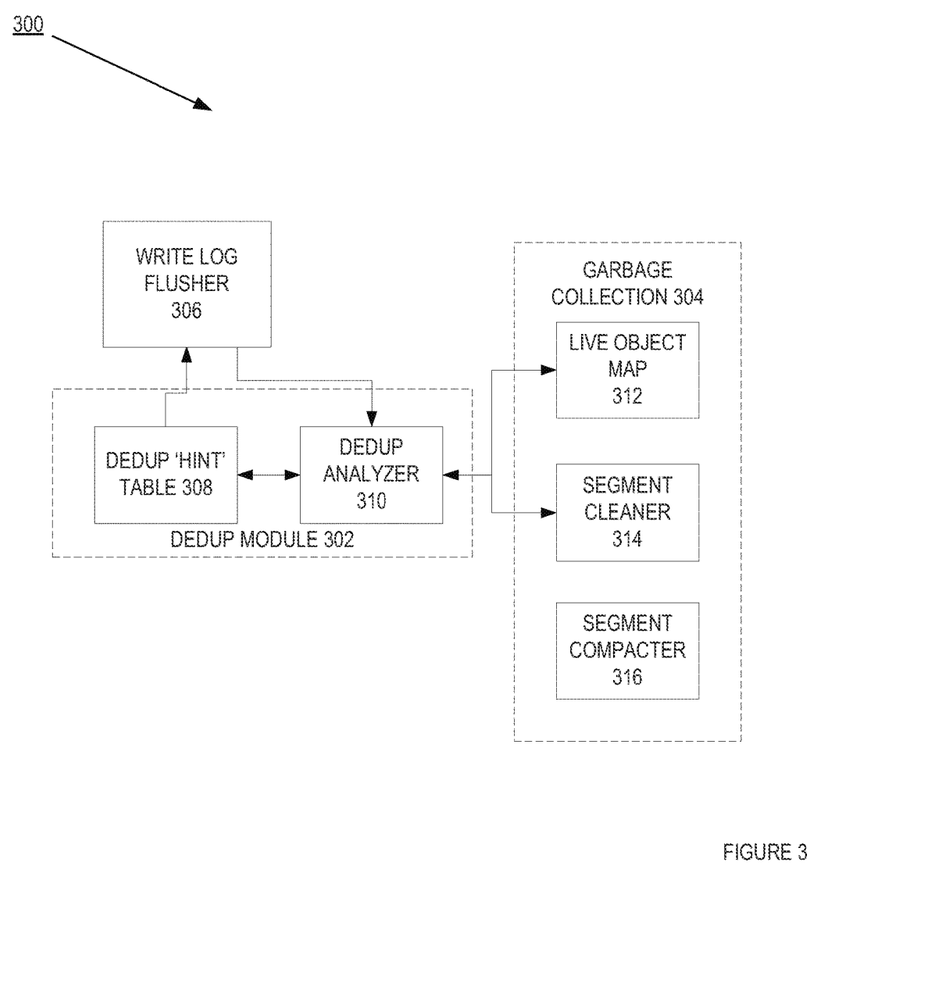
FIG. 3 is an illustration of one embodiment of a deduplication module.

FIG. 3 is an illustration of one embodiment of a deduplication module 302 and garbage collection module 304. In one embodiment, the deduplication analyzer 310 generates the deduplication hint table 308 by analyzing the streams of new objects that are written to the storage. In one embodiment, the hint table includes a 'content fingerprint' to the object's VBA. In this embodiment, a goal is to store a content fingerprint for those VBAs of those objects that are likely to be deduplicated. In one embodiment, one of the ways this can be achieved is by keeping track of top-K statistics for the objects. In one embodiment, the top-K statistic is a partial ordering method where the top K elements of the set are identified and ordered instead of ordering the entire set. For example, top 10 most sold cars make/model out of all types of cars are identified and sorted. In one embodiment, the StorFS system performs deduplication when the writelog flusher flushes data from fast storage to persistent storage so as to avoid storing duplicates to the persistent storage. In another embodiment, the StorFS system can perform deduplication at another step (e.g., upon initial storage).

In one embodiment, the garbage collection module includes a live object map 312, segment cleaner 314, and segment compactor 316. In one embodiment, the live object map 312 is a map of the live objects stored in the StorFS system. In one embodiment, the segment cleaner 314 scans the block segments to check the number of live objects they contain and generate a segment summary statistic. In one embodiment, the segment compactor 316 compacts segments whose utilization drops below a certain threshold.

Figure 4:
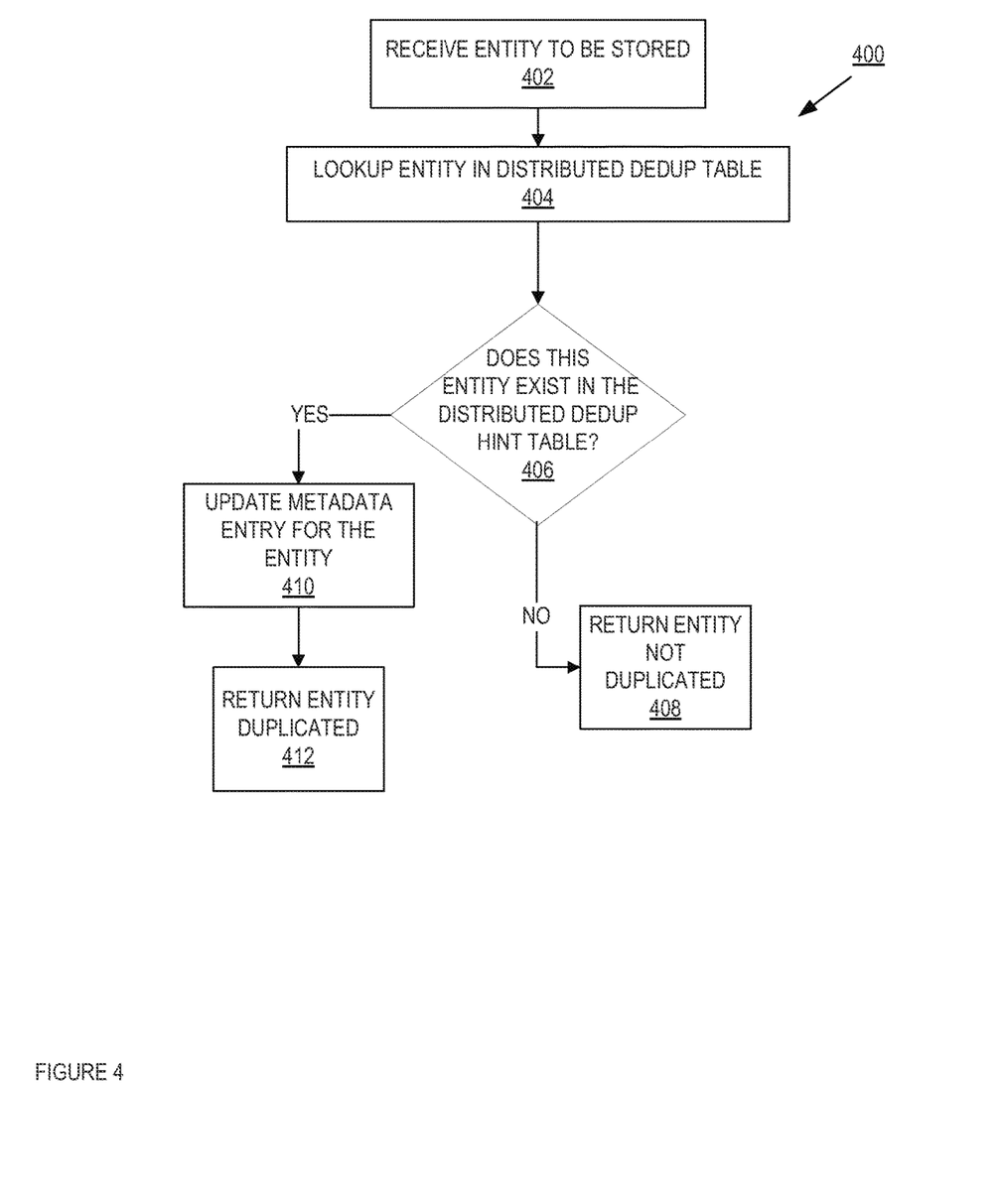
FIG. 4 is a flow diagram of one embodiment of a process to determine if the data is duplicated.

As described above, the StorFS system uses a hint table to determine if the data being flushed is duplicated elsewhere in the StorFS system. FIG. 4 is a flow diagram of one embodiment of a process 400 to determine if the data is duplicated using a hints table. In one embodiment, process 400 is performed by deduplication analyzer, such as deduplication analyzer 310 as described in FIG. 3 above. In FIG. 4, process 400 begins by receiving the entity to be stored. In one embodiment, the entity can be an object, file, key-value pair, etc. Process 400 looks up the entity in the distributed deduplication table to determine if the entity is stored elsewhere in the system at block 404. In one embodiment, the distributed deduplication table is a hint table that stores information about some of the entities stored in the StorFS system. For example and in one embodiment, the hint table stores the top-K statistics of the entities. In one embodiment, the hint table contains the fingerprint of some of the entities that are most likely to be deduplicated. The top-K statistic is one example of creating the hint table. It stores the top K most frequently occurring entities in the StorFS storage. In one embodiment, K can be a positive integer ranging from one to a number less than the total number of objects stored in StorFS system. While in one embodiment, K can be fixed, in alternate embodiments, K can vary depending on the number of objects stored. For example and in one embodiment, K could be a percentage of the number of objects stored.

At block 406, process 400 determines if the entity exists in the distributed deduplication table based on the lookup at block 404. In one embodiment, process 400 checks if the entity is duplicated at the VBA level. Determining if the entity is duplicated at the VBA level is further described in FIG. 4 below. If the entity does not exist in the distributed deduplication table, process 400 returns a status that the entity is not duplicated at block 408. If the entity is in the distributed deduplication table, process 400 updates the metadata for the entity at block 410. In one embodiment, process 400 updates the metadata tree to point to the duplicate. This duplicate may or may not reside in the same vNode.

Figure 5:
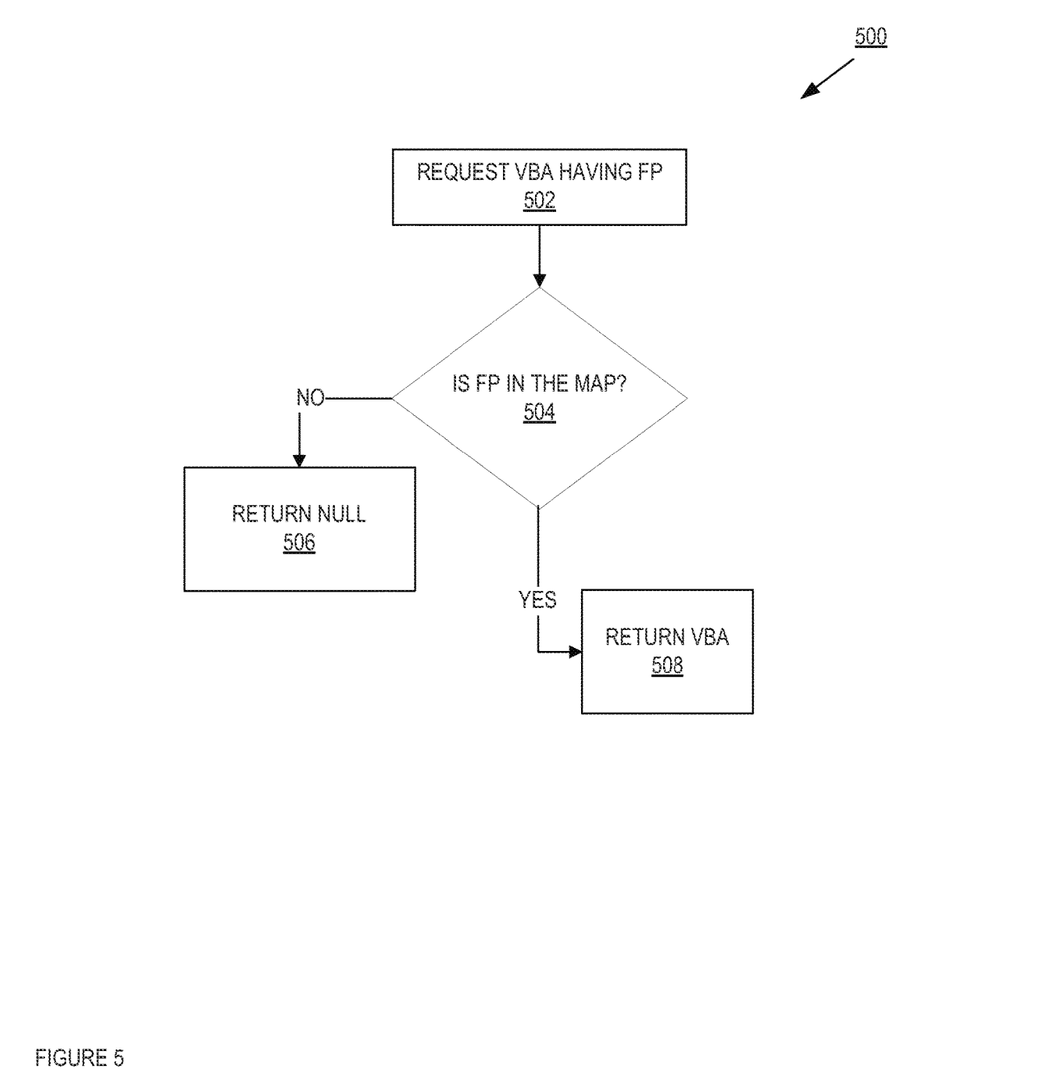
FIG. 5 is a flow diagram of one embodiment of a process to lookup a virtual block address (VBA) based on the content fingerprint.

As described above, the data deduplication check is performed at the VBA level. FIG. 5 is a flow diagram of one embodiment of a process 500 to lookup a VBA based on the content fingerprint. In one embodiment, process 500 is performed by process to lookup a VBA, such process 400 at block 404 above. In FIG. 5, process 500 requests a VBA to be checked for duplication. In one embodiment, this VBA has a fingerprint available (e.g., the fingerprint is stored with the VBA, the fingerprint can be calculated on the fly, etc.). The fingerprint for this VBA is determined using a fingerprinting method as known in the art (e.g., SHA-1 fingerprint, etc.). At block 504, process 500 determines if the fingerprint is in the map for the hints table. In one embodiment, this map is part of the hints table that includes the top-K statistics of fingerprint as described in FIG. 5. If the fingerprint for this VBA is in the map, at block 508, process 500 returns the VBA, which indicates that this VBA is duplicated in the StorFS system. If the fingerprint is not in the map, at block 506, process 500 returns NULL, indicating that this VBA is not duplicated in the StorFS system.

As mentioned earlier, the StorFS system uses a two-level indexing scheme that maps the logical address to a virtual block address (VBA) and from the VBAs to physical block address (PBA). The system allows for objects with contiguous VBAs to be stored close to each other. This addressing scheme further enables fast lookup of objects from the underlying media and reduces defragmentation significantly. As described above, VBAs are unique across the StorFS cluster and no two objects in the cluster will have the same VBA.

Figure 6:
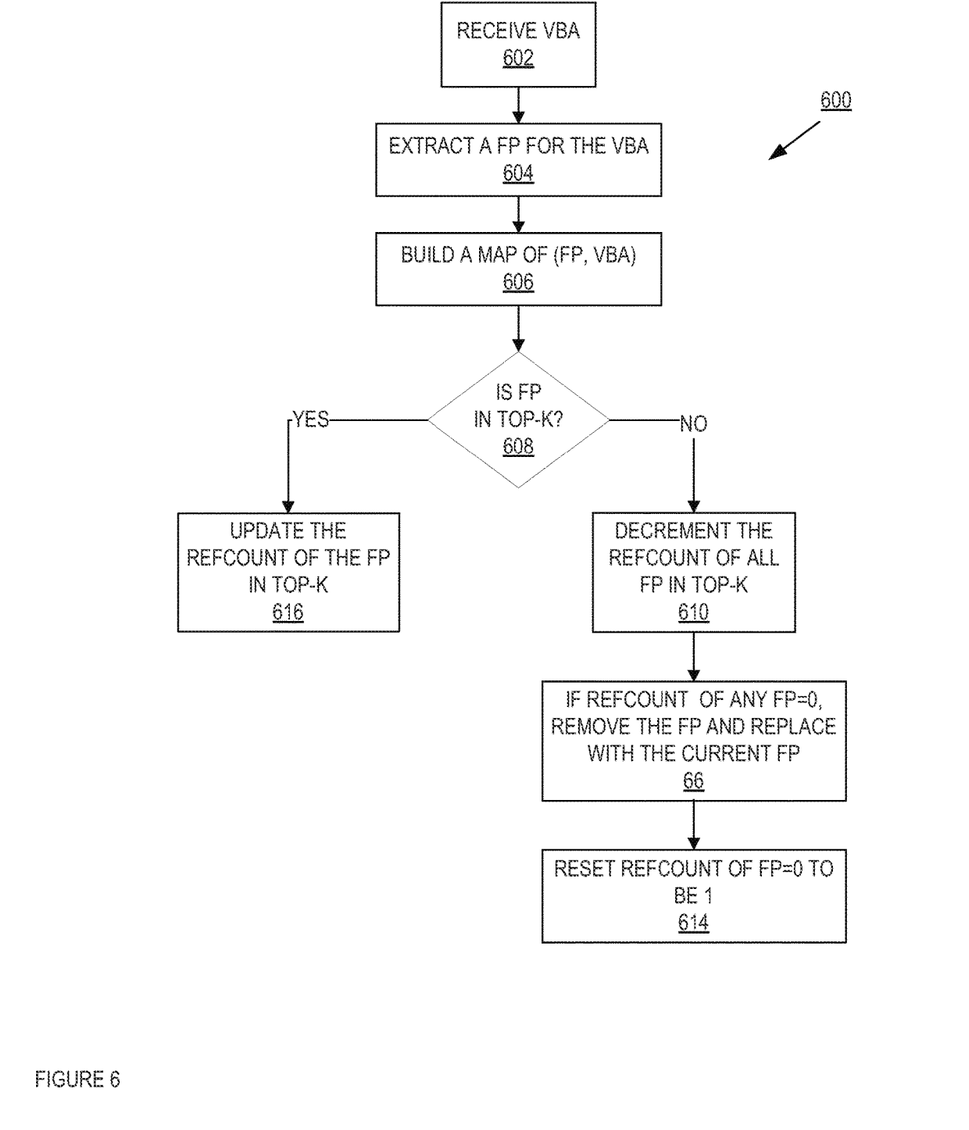
FIG. 6 is a flow diagram of one embodiment of a process to prepare and maintain a hint table that is used for data deduplication.

In one embodiment, the StorFS system checks to determine if the data is duplicated elsewhere in the system using a hints table. FIG. 6 is a flow diagram of one embodiment of a process 600 to prepare and maintain a hint table that is used for data deduplication. In one embodiment, process 600 builds that hint table on a VBA basis. In one embodiment, the hints table stores statistics about a partial set of data in the StorFS system and is a map for a fingerprint and a VBA is the StorFS system and a reference count. In FIG. 6, process 600 receives the VBA to be analyzed at block 602. At block 604, process 600 extracts a fingerprint for this VBA using a method know in the art (e.g., SHA-1 fingerprint, etc.). In one embodiment, the fingerprint is computed when an object first enters the StorFS system. In another embodiment, the fingerprint is computed in line with an incoming I/O operation. At block 608, process 600 determines if this fingerprint is in the top-K statistics. If the fingerprint is in the top-K statistics, at block 616, process 600 updates the reference count for this fingerprint in the top-K.

If the fingerprint is not in the top-K statistics, at block 610, process 600 decrements the reference count of the fingerprints in the top-K statistics. At block 612, process 600 determines if the reference count for a fingerprint is zero, and if so, process 600 removes that fingerprint and replaces the zero referenced fingerprint with the new fingerprint. At block 614, process 600 resets the reference count for each zero referenced fingerprint to be one.

Figure 7:
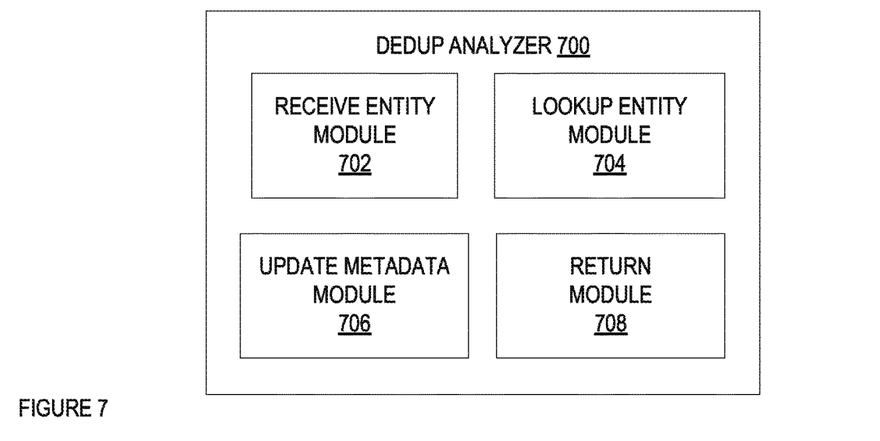
FIG. 7 is a block diagram of one embodiment of a deduplication analyzer that determines if the data is duplicated.

FIG. 7 is a block diagram of one embodiment of a deduplication analyzer 310 that determines if the data is duplicated. In one embodiment, the deduplication analyzer 310 includes a receive entity module 702, lookup entity module 704, update metadata module 706, and return module 708. In one embodiment, the receive entity module 702 receives the entity to be analyzed as described in FIG. 4, block 402 above. The lookup entity module 704 looks up the entity in the hint table as described in FIG. 4, block 404 above. The update metadata module 706 updates the metadata as described in FIG. 4, block 410 above. The return module 708 returns whether the entity is duplicated or not as described in FIG. 4, blocks 408 and 412 above.

Figure 8:
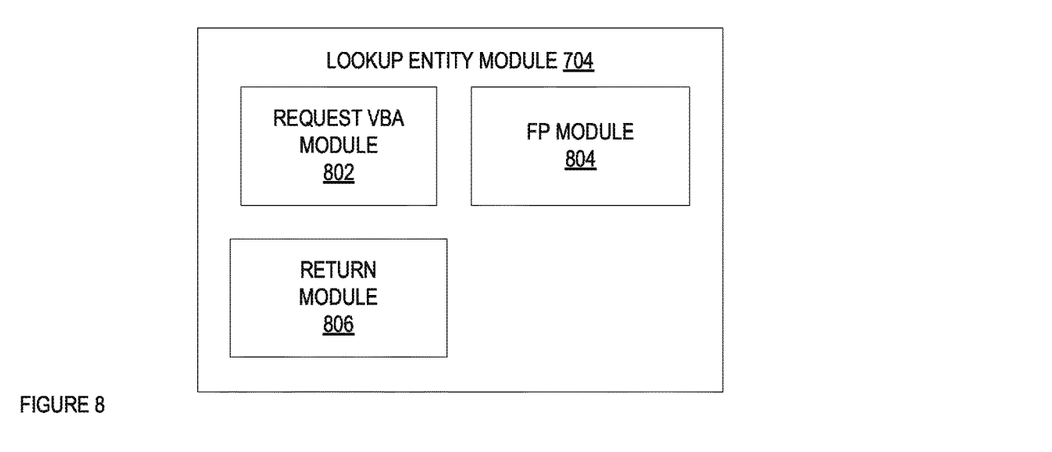
FIG. 8 is a block diagram of one embodiment of a lookup entity module that lookup a VBA based on the content fingerprint.

FIG. 8 is a block diagram of one embodiment of a lookup entity module 704 that performs a lookup of a VBA based on the content fingerprint. In one embodiment, the lookup entity module 804 includes request a request VBA module 802, FP module 804, and return module 806. In one embodiment, the request VBA module 802 requests whether a VBA is in the hints table as described in FIG. 5, block 502 above. The FP module 804 determines if the FP is in the map as described in FIG. 5, block 504 above. The return module 806 returns whether the VBA is in the map as described in FIG. 5, blocks 506 and 508 above.

Figure 9:
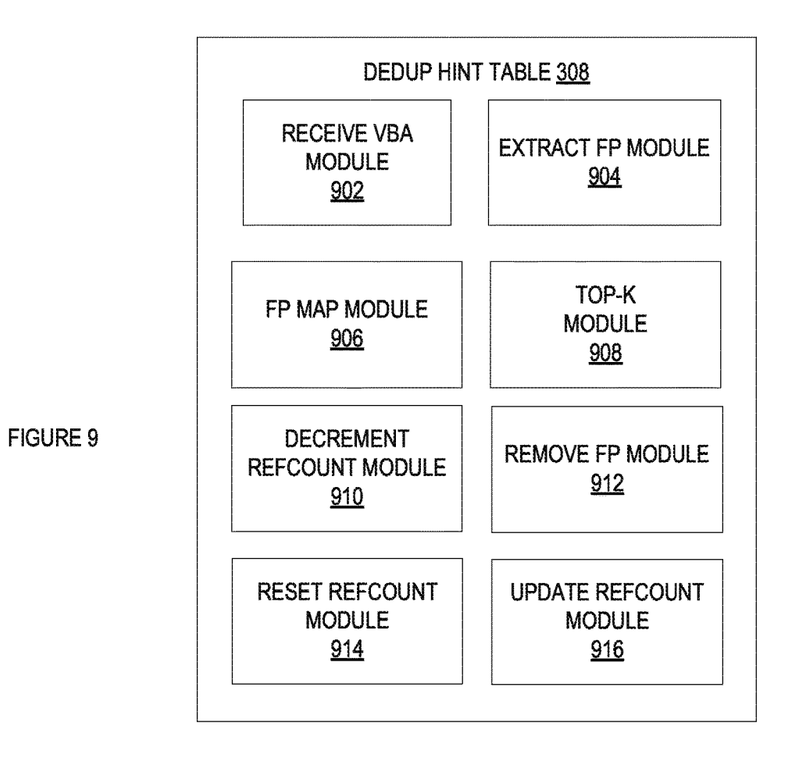
FIG. 9 is a block diagram of one embodiment of a deduplication hint table that prepares and maintains a hint table that is used for data deduplication.

FIG. 9 is a block diagram of one embodiment of a deduplication hint table 308 that prepares and maintains a hint table that is used for data deduplication. In one embodiment, the deduplication hint table 308 includes a receive VBA module 902, extract FP module 904, FP map module 906, Top-K module 908, decrement refcount module 910, remove FP module 912, reset refcount module 914, and update refcount module 916. In one embodiment, the receive VBA module 902 receives the VBA as described in FIG. 6, block 602 above. The extract FP module 904 extract a fingerprint for the VBA as described in FIG. 6, block 604 above. The FP map module 906 maps the VBA to the fingerprint as described in FIG. 6, block 606 above. The Top-K module 908 determines if the fingerprint is in the top-K fingerprints as described in FIG. 6, block 608 above. The decrement refcount module 910 decrements that refcount of all fingerprints in the top-K of fingerprints as described in FIG. 6, block 610 above. The remove FP module 912 removes fingerprints with a refcount of zero as described in FIG. 6, block 612 above. The reset refcount module 914 resets zero refcounts as described in FIG. 6, block 614 above. The update refcount module 916 updated the refcount as described in FIG. 6, block 616 above.

Figure 10:
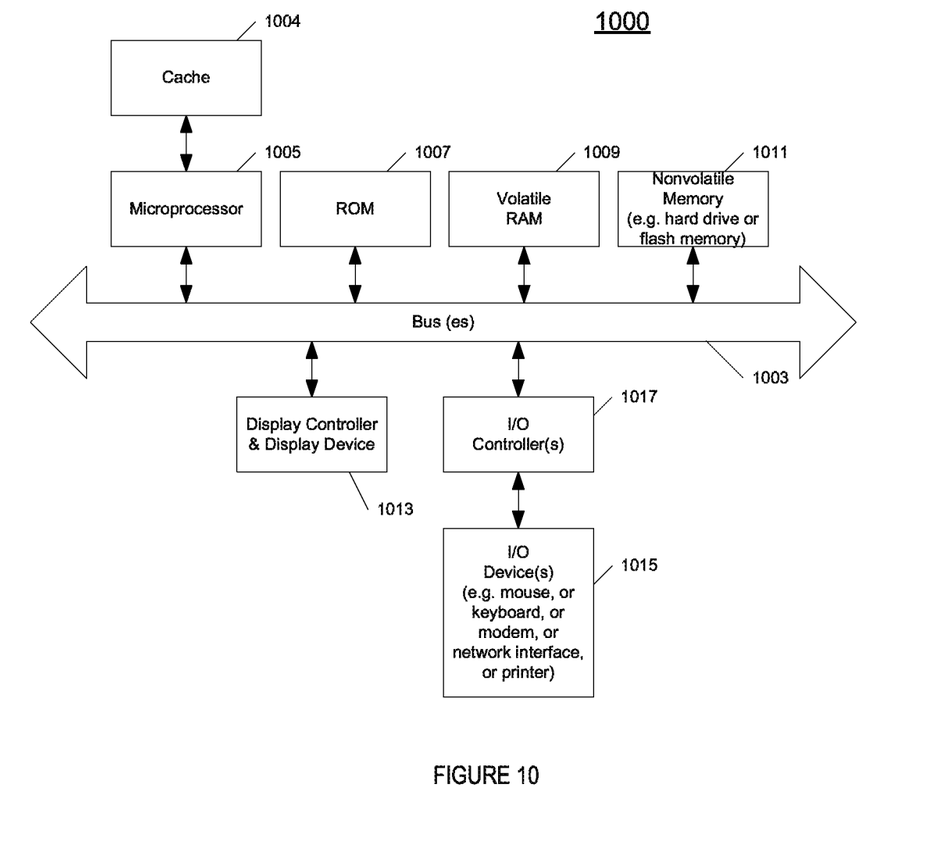
FIG. 10 illustrates one example of a typical computer system, which may be used in conjunction with the embodiments described herein.

FIG. 10 shows one example of a data processing system 1000, which may be used with one embodiment of the present invention. For example, the system 1000 may be implemented including a physical server 102A-C as shown in FIG. 1. Note that while FIG. 10 illustrates various components of a computer system, it is not intended to represent any particular architecture or manner of interconnecting the components as such details are not germane to the present invention. It will also be appreciated that network computers and other data processing systems or other consumer electronic devices, which have fewer components or perhaps more components, may also be used with the present invention.

As shown in FIG. 10, the computer system 1000, which is a form of a data processing system, includes a bus 1003 which is coupled to a microprocessor(s) 1005 and a ROM (Read Only Memory) 1007 and volatile RAM 1009 and a non-volatile memory 1011. The microprocessor 1005 may retrieve the instructions from the memories 1007, 1009, 1011 and execute the instructions to perform operations described above. The bus 1003 interconnects these various components together and also interconnects these components 1005, 1007, 1009, and 1011 to a display controller and display device 1013 and to peripheral devices such as input/output (I/O) devices which may be mice, keyboards, modems, network interfaces, printers and other devices which are well known in the art. Typically, the input/output devices 1015 are coupled to the system through input/output controllers 1017. The volatile RAM (Random Access Memory) 1009 is typically implemented as dynamic RAM (DRAM), which requires power continually in order to refresh or maintain the data in the memory.

The mass storage 1011 is typically a magnetic hard drive or a magnetic optical drive or an optical drive or a DVD RAM or a flash memory or other types of memory systems, which maintain data (e.g. large amounts of data) even after power is removed from the system. Typically, the mass storage 1011 will also be a random access memory although this is not required. While FIG. 10 shows that the mass storage 1011 is a local device coupled directly to the rest of the components in the data processing system, it will be appreciated that the present invention may utilize a non-volatile memory which is remote from the system, such as a network storage device which is coupled to the data processing system through a network interface such as a modem, an Ethernet interface or a wireless network. The bus 1003 may include one or more buses connected to each other through various bridges, controllers and/or adapters as is well known in the art.

Portions of what was described above may be implemented with logic circuitry such as a dedicated logic circuit or with a microcontroller or other form of processing core that executes program code instructions. Thus processes taught by the discussion above may be performed with program code such as machine-executable instructions that cause a machine that executes these instructions to perform certain functions. In this context, a "machine" may be a machine that converts intermediate form (or "abstract") instructions into processor specific instructions (e.g., an abstract execution environment such as a "process virtual machine" (e.g., a Java Virtual Machine), an interpreter, a Common Language Runtime, a high-level language virtual machine, etc.), and/or, electronic circuitry disposed on a semiconductor chip (e.g., "logic circuitry" implemented with transistors) designed to execute instructions such as a general-purpose processor and/or a special-purpose processor. Processes taught by the discussion above may also be performed by (in the alternative to a machine or in combination with a machine) electronic circuitry designed to perform the processes (or a portion thereof) without the execution of program code.

The present invention also relates to an apparatus for performing the operations described herein. This apparatus may be specially constructed for the required purpose, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), RAMs, EPROMs, EEPROMs, magnetic or optical cards, or any type of media suitable for storing electronic instructions, and each coupled to a computer system bus.

A machine readable medium includes any mechanism for storing or transmitting information in a form readable by a machine (e.g., a computer). For example, a machine readable medium includes read only memory ("ROM"); random access memory ("RAM"); magnetic disk storage media; optical storage media; flash memory devices; etc.

An article of manufacture may be used to store program code. An article of manufacture that stores program code may be embodied as, but is not limited to, one or more memories (e.g., one or more flash memories, random access memories (static, dynamic or other)), optical disks, CD-ROMs, DVD ROMs, EPROMs, EEPROMs, magnetic or optical cards or other type of machine-readable media suitable for storing electronic instructions. Program code may also be downloaded from a remote computer (e.g., a server) to a requesting computer (e.g., a client) by way of data signals embodied in a propagation medium (e.g., via a communication link (e.g., a network connection)).

The preceding detailed descriptions are presented in terms of algorithms and symbolic representations of operations on data bits within a computer memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "determining," "transmitting," "computing," "detecting," "performing," "looking," "communicating," "reading," "writing," "transferring," "updating," "incrementing," "decrementing," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The processes and displays presented herein are not inherently related to any particular computer or other apparatus. Various general-purpose systems may be used with programs in accordance with the teachings herein, or it may prove convenient to construct a more specialized apparatus to perform the operations described. The required structure for a variety of these systems will be evident from the description below. In addition, the present invention is not described with reference to any particular programming language. It will be appreciated that a variety of programming languages may be used to implement the teachings of the invention as described herein.

The foregoing discussion merely describes some exemplary embodiments of the present invention. One skilled in the art will readily recognize from such discussion, the accompanying drawings and the claims that various modifications can be made without departing from the spirit and scope of the invention.

What is claimed is:

1. A non-transitory machine-readable medium having executable instructions to cause one or more processing units to perform a method to determine duplicative data in a distributed storage system, the method comprising:
   determining, at a first one of a plurality of storage controller servers, if a first entity is duplicated by a second entity in the distributed storage system for deduplication, wherein the second entity is stored on a second one of the plurality of storage controller servers in the distributed storage system, the distributed storage system includes the plurality of storage controller servers, and the determining if the first entity is duplicated includes,
      receiving the first entity to be stored in the distributed storage system, wherein the determination if the first entity is for deduplication occurs when the first entity is flushed from a write log in fast storage to persistent storage,
      building a data deduplication table indicating a top-K entities in the distributed storage system, wherein a number of the top-K entities is less than a total number of entities in the distributed storage system,
      looking up the first entity in the data deduplication table,
      if the first entity exists in the data deduplication table, updating metadata for the first entity to indicate that a virtual node associated with the second entity stores a duplicate of the first entity, wherein the virtual node is further mapped to the second one of the plurality of storage controller servers, the virtual node stores a collection of a plurality of objects that includes the second entity, and the metadata for the first entity is stored in another virtual node,
      wherein the building the data deduplication table comprises:
         for each of a plurality of stored entities,
            computing a current fingerprint for each of the plurality of the stored entities,
            if the current fingerprint is in top-K fingerprints as indicated in the data deduplication table, incrementing a reference count for the current fingerprint, and
            if the current fingerprint is not in the top-K fingerprints,
               decrementing reference counts of all other fingerprints indicated in the top-K fingerprints, and
               removing zero reference count fingerprints, and
      if the first entity is duplicated, removing the first entity from the distributed storage system.

2. The non-transitory machine-readable medium of claim 1, wherein the data deduplication table includes hints about which entities are stored in the distributed storage system.

3. The non-transitory machine-readable medium of claim 2, wherein each of the hints is a fingerprint of an entity that is stored in the distributed storage system.

4. The non-transitory machine-readable medium of claim 3, wherein the looking up the first entity comprises:
   computing a fingerprint for the first entity when the first entity arrives in the distributed storage system; and
   looking up the fingerprint in the data deduplication table.

5. The non-transitory machine-readable medium of claim 1, wherein the data deduplication table includes hints about which of a top-K entities are stored in the distributed storage system.

6. The non-transitory machine-readable medium of claim 1, wherein the data deduplication table is globally available to the plurality of storage controller servers for data deduplication determinations.

7. The non-transitory machine-readable medium of claim 1, wherein the building the data deduplication table further comprises, if the current fingerprint is not in the top-K fingerprints,
   adding the current fingerprint to the data deduplication table, and
   setting a reference count for the current fingerprint to one.

8. The non-transitory machine-readable medium of claim 7, wherein the adding includes replacing one of the removed zero reference count fingerprints with the current fingerprint.

9. A computerized method that determines duplicative data in a distributed storage system, the method comprising:
   determining, at the first one of a plurality of storage controller servers, if a first entity stored on a first virtual node is duplicated by a second entity in the distributed storage system for deduplication, wherein a second entity is stored on a second virtual node, the distributed storage system includes the plurality of storage controller servers and a plurality of virtual nodes, the plurality of virtual nodes includes the first and second virtual nodes, and the determining if the first entity is duplicated includes,
      receiving the first entity to be stored in the distributed storage system, wherein the determination if the first entity is for deduplication occurs when the first entity is flushed from a write log in fast storage to persistent storage,
      building a data deduplication table indicating a top-K entities in the distributed storage system, wherein a number of the top-K entities is less than a total number of entities in the distributed storage system,
      looking up the first entity in the data deduplication table, if
      the first entity exists in the data deduplication table, updating metadata for the first entity to indicate that the second virtual node stores a duplicate of the first entity, wherein the second virtual node is further mapped to one of the plurality of storage controller servers, the virtual node stores a collection of a plurality of objects that includes the second entity, and the metadata for the first entity is stored in another virtual node,
wherein the building the data deduplication table comprises:
for each of a plurality of stored entities,
computing a current fingerprint for each of the plurality of the stored entities,
if the current fingerprint is in top-K fingerprints as indicated in the data deduplication table,
incrementing a reference count for the current fingerprint, and
if the current fingerprint is not in the top-K fingerprints,
decrementing reference counts of all other fingerprints indicated in the top-K fingerprints, and
removing zero reference count fingerprints, and
if the first entity is duplicated, removing the first entity from the distributed storage system.

10. The method of claim 9, wherein the data deduplication table includes hints about which entities are stored in the distributed storage system.

11. The method of claim 10, wherein each of the hints is a fingerprint of an entity that is stored in the distributed storage system.

12. The method of claim 11, wherein the looking up the first entity comprises:
computing a fingerprint for the first entity in line with an incoming input/output operation; and
looking up the fingerprint in the data deduplication table.

13. The method of claim 9, wherein the data deduplication table includes hints about which of a top-K entities are stored in the distributed storage system.

14. The method of claim 9, wherein the data deduplication table is globally available to the plurality of storage controller servers for data deduplication determinations.

15. The method of claim 9, wherein the building the data deduplication table further comprises, if the current fingerprint is not in the top-K fingerprints,
adding the current fingerprint to the data deduplication table, and
setting a reference count for the current fingerprint to one.

16. The method of claim 15, wherein the adding includes replacing one of the removed zero reference count fingerprints with the current fingerprint.

17. A distributed storage system to determine duplicative data in a distributed storage system, the distributed storage system comprising:
an interconnection network; and
a plurality of storage servers, interconnected by the interconnection network, wherein each of the plurality of storage servers includes,
a processing unit,
a first set of instructions, executed by the processing unit, that determines
if a first entity is duplicated by a second entity in the distributed storage system for deduplication, wherein the first entity is stored on a first one of the plurality of storage servers, the second entity is stored on a second one of the plurality storage servers in the distributed storage system, wherein the determination if the first entity is for deduplication occurs when the first entity is flushed from a write log in fast physical storage to persistent physical storage of the distributed storage system, and the first set of instructions includes,
a second set of instructions that receives the first entity to be stored in the distributed storage system, and builds a data deduplication table indicating a top-K entities in the distributed storage system, wherein a number of the top-K entities is less than a total number of entities in the distributed storage system,
a third set of instructions that looks up the first entity in the data deduplication table, and
a fourth set of instructions that updates metadata for the first entity to indicate a virtual node associated with the second entity that stores a duplicate of the first entity if the second entity exists in the data deduplication table, wherein the second virtual node is further mapped to one of the plurality of storage servers, the virtual node stores a collection of a plurality of objects that includes the second entity, and the metadata for the first entity is stored in another virtual node
wherein the second set of instructions includes instructions to cause the building the data deduplication table by:
for each of a plurality of stored entities,
computing a current fingerprint for each of the plurality of the stored entities,
if the current fingerprint is in top-K fingerprints as indicated in the data deduplication table,
incrementing a reference count for the current fingerprint, and,
if the current fingerprint is not in the top-K fingerprints,
decrementing reference counts of all other fingerprints indicated in the top-K fingerprints, and
removing zero reference count fingerprints, and
a fifth set of instructions that, if the first entity is duplicated, removes the first entity from the distributed storage system.

18. The distributed storage system of claim 17, wherein the third set of instructions that looks up looks up by:
computing a fingerprint for the first entity when the first entity arrives in the distributed storage system; and
looking up the fingerprint in the data deduplication table.

19. The distributed storage system of claim 17, wherein the data deduplication table is globally available to the plurality of storage servers for data deduplication determinations.

20. The distributed storage system of claim 17, wherein the second set of instructions builds the data deduplication table by, if the current fingerprint is not in the top-K fingerprints,
adding the current fingerprint to the data deduplication table, and
setting a reference count for the current fingerprint to one.

* * * * *